(12) United States Patent
Kohsiek

(10) Patent No.: US 6,677,816 B2
(45) Date of Patent: Jan. 13, 2004

(54) CIRCUIT ARRANGEMENT FOR DEMODULATING SIGNALS

(75) Inventor: Cord-Heinrich Kohsiek, Ellerau (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/227,213

(22) Filed: Aug. 23, 2002

(65) Prior Publication Data
US 2003/0048131 A1 Mar. 13, 2003

(30) Foreign Application Priority Data

Aug. 28, 2001 (DE) .......................... 101 42 019

(51) Int. Cl.[7] .............................................. H03D 3/00
(52) U.S. Cl. ...................... 329/315; 329/319; 329/323; 332/117; 332/123
(58) Field of Search ................ 332/107, 112, 332/117, 123, 126, 127, 128; 329/315, 316, 318, 319, 320, 321, 323; 455/205, 208, 209, 210, 222, 230, 255

(56) References Cited

U.S. PATENT DOCUMENTS

| | | | | |
|---|---|---|---|---|
| 4,313,215 A | * | 1/1982 | Jansen | 455/212 |
| 4,731,872 A | * | 3/1988 | Washburn, Jr. | 455/210 |
| 4,754,228 A | * | 6/1988 | Tomlinson | 329/124 |
| 4,903,332 A | * | 2/1990 | Hansen | 455/209 |
| 4,991,226 A | * | 2/1991 | Bongiorno | 455/200 |
| 5,097,221 A | * | 3/1992 | Miller | 329/318 |
| 5,550,869 A | * | 8/1996 | Gurantz et al. | 375/340 |
| 5,584,062 A | * | 12/1996 | Meador et al. | 455/260 |
| 5,606,731 A | * | 2/1997 | Pace et al. | 455/260 |
| 5,691,666 A | * | 11/1997 | Owen | 329/319 |
| 5,715,529 A | * | 2/1998 | Kianush et al. | 455/266 |
| 6,275,542 B1 | * | 8/2001 | Katayama et al. | 375/322 |

* cited by examiner

Primary Examiner—Timothy P. Callahan
Assistant Examiner—Hai L. Nguyen
(74) Attorney, Agent, or Firm—Aaron Waxler

(57) ABSTRACT

In a circuit arrangement for demodulating signals, particularly frequency-modulated signals, in which a limiter, to whose input the signals to be modulated can be applied, is followed by a demodulator from whose output the demodulated signals can be derived, the outputs of the demodulator and the limiter are connected to a respective input of a mixer whose output is connected to the input of the limiter via a low-pass filter.

4 Claims, 1 Drawing Sheet

CIRCUIT ARRANGEMENT FOR DEMODULATING SIGNALS

Figure 1:
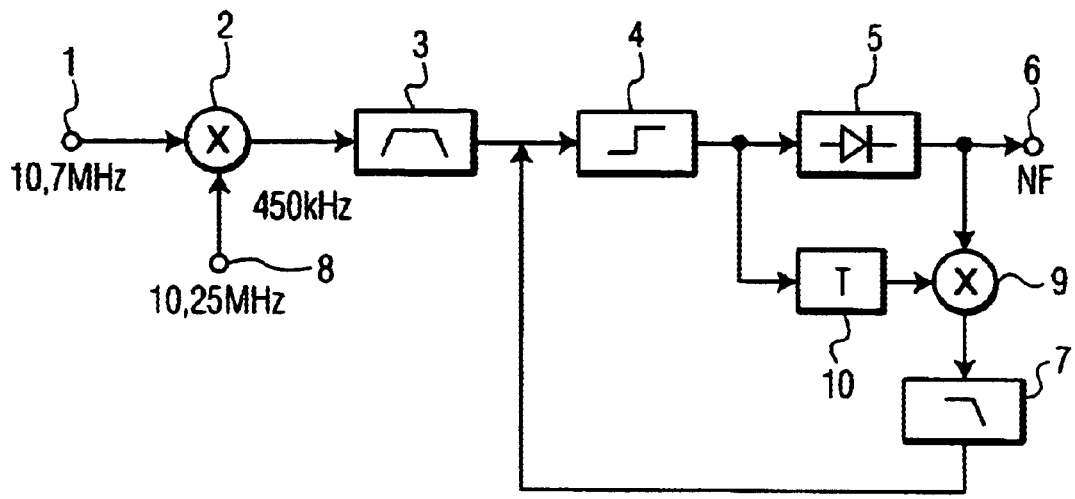

The invention relates to a circuit arrangement for demodulating signals, particularly frequency-modulated signals, in which a limiter, to whose input the signals to be modulated can be applied, is followed by a demodulator from whose output the demodulated signals can be derived.

Circuit arrangements as defined in claim 1 have been used for a long time in different receivers, for example, in radio receivers and are illustrated, for example, in the Valvo Handbook "Integrierte Analog-schaltungen für Rundfunk und NF-Anwendungen, 1981", p. 60. In addition to the desired demodulated output signal, the demodulator also generates unwanted residues of the carrier frequency or of the intermediate frequency. When demodulated signals are to be evaluated, whose frequencies are near these unwanted frequencies, the signal processing will be disturbed. Such a disturbance occurs, for example, in an FM demodulator of a car radio with a low intermediate frequency.

It is an object of the invention to suppress disturbing carrier residues at the output of the demodulator. This object is achieved by the circuit arrangement according to the invention in that the outputs of the demodulator and the limiter are connected to a respective input of a mixer whose output is connected to the input of the limiter via a low-pass filter.

The invention is based on the recognition that manufacture-conditioned spreads of parameters (offsets) of the components used cause the above-mentioned disturbances and generate an asymmetrical signal processing. These offsets can be largely reduced by the measures according to the invention. The residue of the intermediate frequency in the output signal is thus much smaller than in conventional circuits.

In accordance with a further embodiment of the circuit arrangement according to the invention, and dependent on the conditions imposed, it may be advantageous for a phase-equal mixing to connect the output of the limiter to the one input of the mixer via a delay device.

A further advantageous embodiment is characterized in that the limit frequency of the low-pass filter is below the frequency band of the signals to be demodulated.

Furthermore, it is advantageous when the signal to be demodulated is an intermediate frequency signal which can be applied via a bandpass filter.

These and other aspects of the invention are apparent from and will be elucidated with reference to the embodiments described hereinafter.

Figure 2:
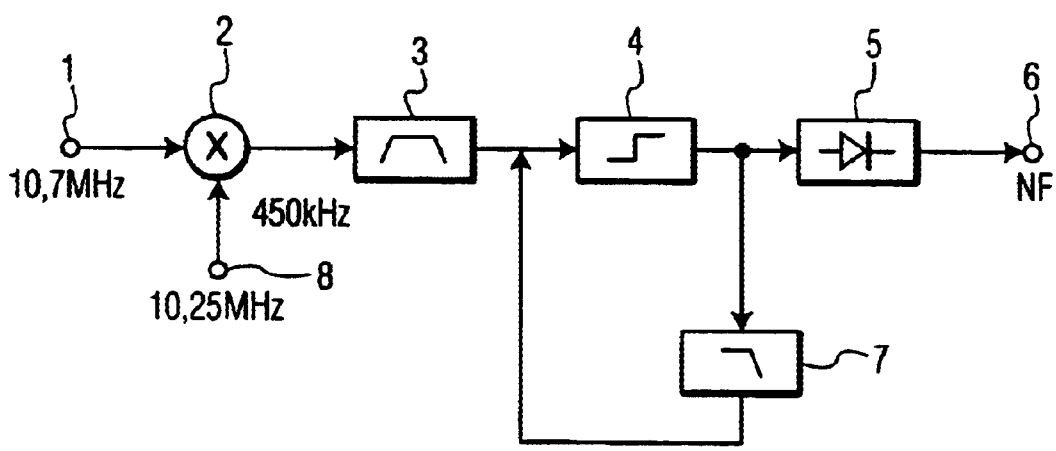

In the drawing:

FIG. 1 is a block diagram of an embodiment of the circuit arrangement according to the invention, and FIG. 2 is a block diagram of a known circuit arrangement.

Identical components are denoted by the same reference numerals in the Figures.

The known circuit arrangement shown in FIG. 2 represents a part of a receiver, for example, a car radio. At 1, a VHF receiver section supplies an IF signal at a frequency of 10.7 MHz. In a mixer 2, a lower intermediate frequency of 450 kHz is generated by means of a 10.25 MHz signal applied at 8, which intermediate frequency is passed through a bandpass filter 3. It is succeeded by the limiter 4 which is usually a limiting amplifier. The frequency-modulated IF signal which is thus amplitude-limited is demodulated in a demodulator 5. The low-frequency signal NF is available at its output. To stabilize the working point of the limiter 4, the DC component of an output signal is separated by means of a low-pass filter 7 and fed back to the limiter input.

In the circuit arrangement according to the invention shown in FIG. 1, the output signal of the limiter 4 is multiplied by the output signal of the demodulator 5 in a further mixer 9. Since the multiplication is to be performed with the correct phase, a delay circuit 10 is provided so as to compensate the delay time within the demodulator. The mixing product is fed back to the input of the limiter 4 via a low-pass filter 7, similarly as in the known circuit arrangement.

What is claimed is:

1. A circuit arrangement for demodulating signals, particularly frequency-modulated signals, in which a limiter, to whose input the signals to be modulated can be applied, is followed by a demodulator from whose output the demodulated signals can be derived, characterized in that the outputs of the demodulator (5) and the limiter (4) are connected to a respective input of a mixer (9) whose output is connected to the input of the limiter (4) via a low-pass filter (7).

2. A circuit arrangement as claimed in claim 1, characterized in that the output of the limiter (4) is connected to the one input of the mixer (9) via a delay device.

3. A circuit arrangement as claimed in claim 1, characterized in that the limit frequency of the low-pass filter (7) is below the frequency band of the signals to be demodulated.

4. A circuit arrangement as claimed in claim 1, characterized in that the signal to be demodulated is an intermediate frequency signal which can be applied via a bandpass filter (3).

* * * * *